(12) United States Patent
Schutz et al.

(10) Patent No.: US 10,411,107 B2
(45) Date of Patent: Sep. 10, 2019

(54) SEMICONDUCTOR DEVICE WITH AIRGAP SPACER FOR TRANSISTOR AND RELATED METHOD

(71) Applicant: GLOBALFOUNDRIES INC., Grand Cayman (KY)

(72) Inventors: Laura J. Schutz, Richmond, VT (US); Anthony K. Stamper, Burlington, VT (US); Siva P. Adusumilli, South Burlington, VT (US); Joshua F. Dillon, Stowe, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 36 days.

(21) Appl. No.: 15/693,537

(22) Filed: Sep. 1, 2017

(65) Prior Publication Data

US 2019/0074364 A1    Mar. 7, 2019

(51) Int. Cl.

| | |
|---|---|
| H01L 29/49 | (2006.01) |
| H01L 29/417 | (2006.01) |
| H01L 29/423 | (2006.01) |
| H01L 21/3205 | (2006.01) |
| H01L 29/66 | (2006.01) |
| H01L 21/8234 | (2006.01) |
| H01L 27/088 | (2006.01) |
| H01L 21/762 | (2006.01) |
| H01L 21/28 | (2006.01) |

(52) U.S. Cl.
CPC .... *H01L 29/4991* (2013.01); *H01L 21/32053* (2013.01); *H01L 21/823468* (2013.01); *H01L 27/088* (2013.01); *H01L 29/41758* (2013.01); *H01L 29/4232* (2013.01); *H01L 29/6653* (2013.01); *H01L 29/6656* (2013.01); *H01L 29/66568* (2013.01); *H01L 29/66575* (2013.01); *H01L 21/28052* (2013.01); *H01L 21/28097* (2013.01); *H01L 21/76224* (2013.01); *H01L 21/823475* (2013.01); *H01L 21/823481* (2013.01); *H01L 29/4238* (2013.01); *H01L 29/4933* (2013.01); *H01L 29/4975* (2013.01)

(58) Field of Classification Search
USPC ........................................................ 257/288
See application file for complete search history.

(56) References Cited

U.S. PATENT DOCUMENTS

| | | |
|---|---|---|
| 5,736,446 A | 4/1998 | Wu |
| 5,914,519 A | 6/1999 | Chou et al. |

(Continued)

*Primary Examiner* — Zandra V Smith
*Assistant Examiner* — Lawrence C Tynes, Jr.
(74) *Attorney, Agent, or Firm* — Anthony Canale; Hoffman Warnick LLC

(57) ABSTRACT

A method may include forming a transistor on a substrate, the transistor including a gate, and forming a sacrificial spacer extending along an entirety of a thickness of the gate. A via layer is then formed over/about the gate. The sacrificial spacer is at least partially removed, leaving an air vent opening. An airgap spacer is formed in the dielectric layer by depositing another dielectric layer to close off the air vent opening. The airgap spacer is coincident with at least one sidewall of the gate and extends along an entirety of a thickness of the gate. Gate airgaps may also be provided over the gate. Other embodiments extend the gate and airgap spacer the full thickness of the dielectric layer thereabout. Other embodiments extend the airgap spacer over the gate.

15 Claims, 10 Drawing Sheets

(56) References Cited

U.S. PATENT DOCUMENTS

| | | | |
|---|---|---|---|
| 5,915,182 A | 6/1999 | Wu | |
| 6,316,347 B1 | 11/2001 | Chang et al. | |
| 8,232,618 B2 | 7/2012 | Breyta et al. | |
| 8,637,930 B2 | 1/2014 | Ando et al. | |
| 2005/0037585 A1 | 2/2005 | Park et al. | |
| 2015/0014759 A1* | 1/2015 | Lee | H01L 23/5329 257/306 |
| 2015/0061134 A1* | 3/2015 | Lee | H01L 21/764 257/751 |
| 2015/0228754 A1* | 8/2015 | Sung | H01L 29/6656 438/595 |
| 2016/0268158 A1* | 9/2016 | Leobandung | H01L 21/7682 |
| 2017/0330790 A1 | 11/2017 | He et al. | |

* cited by examiner

SEMICONDUCTOR DEVICE WITH AIRGAP SPACER FOR TRANSISTOR AND RELATED METHOD

BACKGROUND

The present disclosure relates to semiconductor device fabrication, and more specifically, to a semiconductor device having an airgap spacer for a transistor. The airgap spacer extends the entire thickness of the gate.

Reduction in off capacitance is a challenge in designing semiconductor devices. A high capacitance is attributable to the relative size of the first metal to first contact to gate body region in a field effect transistor (FET). A high first metal level and zero via level capacitance limits certain FETs off capacitance (Coff) such as n-type FETs. Consequently, reduction in the capacitance of the material in this region helps reduce the overall Coff for the FET. One conventional approach to address this situation includes using airgap spacers at the gate level, i.e., adjacent part of the gate body. While this approach helps reduce capacitance, current approaches form the zero via level after forming airgap spacers. When the zero via level is formed over the airgap spacers and the gates, it reduces the efficacy of the airgap spacers. For example, when the airgap spacers are capped off with an interlayer dielectric (ILD) for the zero via level, the ILD fills part of the airgap spacer, reducing its efficacy to reduce capacitance of the material. Current techniques to address this latter challenge create complex shaped airgap spacers and/or require various additional and oftentimes complex processing steps. Where airgap spacer formation has been attempted after zero via level formation, it has resulted in very large airgaps that create structural integrity issues.

SUMMARY

A first aspect of the disclosure is directed to a semiconductor device, comprising: a transistor on a substrate, the transistor including a gate body; a first dielectric layer about the gate body; an airgap spacer adjacent to at least one sidewall of the gate body in the first dielectric layer and extending along an entirety of a thickness of the gate body; an air vent passage contiguous with the airgap spacer and extending from the airgap spacer through the first dielectric layer to at least an upper surface of the first dielectric layer; and a second dielectric layer over the first dielectric layer, the second dielectric layer pinching off an upper end of the air vent passage.

A second aspect of the disclosure related to a semiconductor device, comprising: a transistor on a substrate, the transistor including a gate including a gate body over the substrate, a silicide layer over the gate body and a gate stack extender over the silicide layer; a first dielectric layer about the gate, the gate stack extender extending to an upper surface of the first dielectric layer; an airgap spacer in the first dielectric layer, the airgap spacer coincident with at least one sidewall of the gate, the airgap spacer extending along an entirety of a thickness of the gate and extending through an entirety of a thickness of the first dielectric layer; and a second dielectric layer over the first dielectric layer, the second dielectric layer pinching off an upper end of the airgap spacer along a length of the airgap spacer.

A third aspect of the disclosure includes a method, comprising: forming a transistor on a substrate, the transistor including a gate; forming a sacrificial spacer extending along an entirety of a thickness of the gate; forming at least one first dielectric layer about the sacrificial spacer and the gate; forming at least one contact through the at least one first dielectric layer to a portion of the transistor; removing at least a portion of the sacrificial spacer, leaving an air vent opening; and forming an airgap spacer in the at least one first dielectric layer by depositing a second dielectric layer to close off the air vent opening, wherein the airgap spacer is coincident with at least one sidewall of the gate and extends along an entirety of a thickness of the gate.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure relate to semiconductor devices and a related method. The method generally includes forming a sacrificial spacer along an entire thickness of a sidewall of a gate, forming a zero via level over the gate, and then removing the spacer to form an airgap spacer. The resulting semiconductor device includes an airgap spacer that extends an entire thickness of the gate sidewall without having any other spacer material therein to support the airgap spacer. Other embodiments may include having a gate airgap extending above a top surface of the gate, or having the airgap spacer extend vertically upward through a full thickness of the zero via level dielectric layer.

Figure 1:
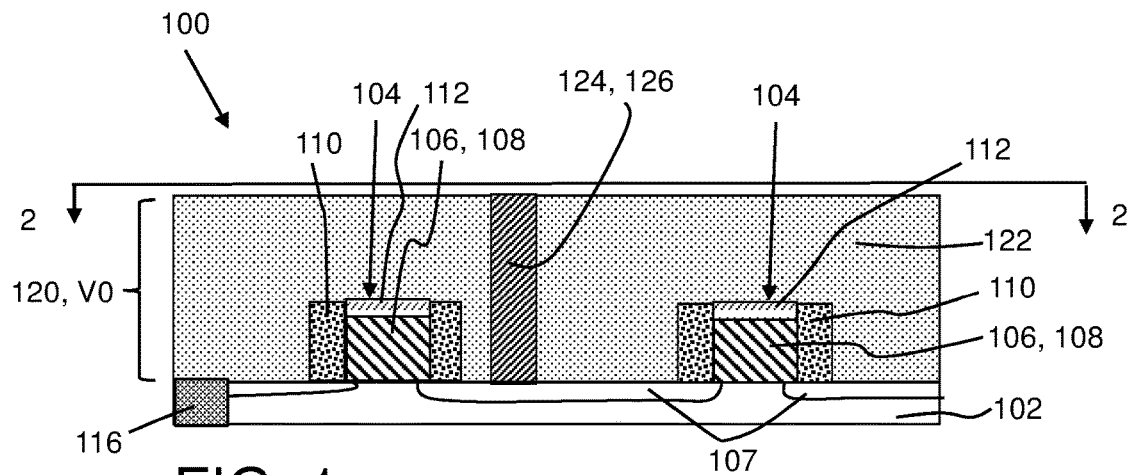
FIG. 1 shows a cross-sectional view of a preliminary structure according to embodiments of the disclosure (see line 1-1 in FIG. 2).
Figure 2:
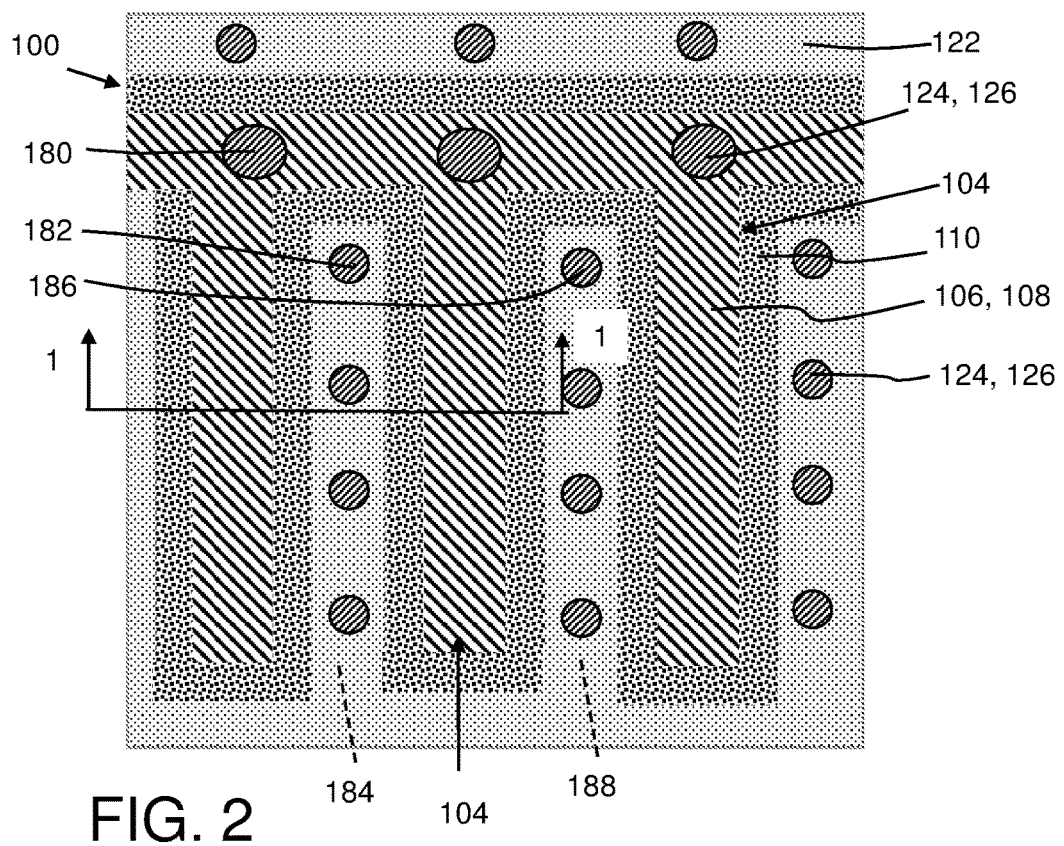
FIG. 2 shows a schematic top view of the preliminary structure of FIG. 1 along line 2-2.

Referring to the drawings, FIG. 1 shows a cross-sectional view of and FIG. 2 shows a schematic top view of a preliminary structure 100 upon which methods according to the disclosure will be performed. Preliminary structure 100 may include a substrate 102, which may be a bulk substrate or a semiconductor-on-insulator (SOI) layer of an SOI substrate. As understood, an SOI substrate may include a semiconductor substrate (bulk) (not shown), a buried insulator layer (not shown) and an SOI layer. Substrate 102, regardless of whether a bulk substrate or an SOI layer of an SOI substrate, may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of substrate 102 may be strained. For example, n-type field effect transistors (FETs) may include a tensile stress imparted to substrate 102.

Substrate 102 may be formed using any now known or later developed process, e.g., by deposition, separation by implantation of oxygen (SIMOX), wafer bonding, etc. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating and/or evaporation.

Preliminary structure 100 may also include a transistor 104 (two shown) including a gate 106. Transistor 104 may also include source/drain (S/D) regions 107, which may be formed using any now known or later developed technique. For example, S/D regions 107 may be formed by doping a portion of substrate 102 between gates 106 with a dopant. For n-type devices, an n-type dopant may be used, which may include but is not limited to: phosphorous (P), arsenic (As), antimony (Sb). For a p-type device, p-type dopants are used, which may include but are not limited to: boron (B), indium (In) and gallium (Ga). Gate 106 is formed over substrate 102, e.g., of a metal or polysilicon. Each gate 106 may include a gate body 108 surrounded at least in part by a sacrificial spacer 110, as will be described in greater detail herein. The material of gate body 108 of each gate 106 may include a thin gate dielectric lower layer (not shown) and a metal or polysilicon body thereover. Gate 106 may be formed using any now known or later developed technique such as but not limited to photolithography, sidewall image transfer, etc. In lithography (or "photolithography"), for example, a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example. Common masking materials are photoresist (resist) and nitride. Nitride is usually considered to be a "hard mask."

"Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as shallow trench isolations (STI) 116.

Gate 106 may also include a silicide layer 112 (FIG. 1 only) formed on top of gate body 108. Silicide layer 112 may be formed using any now known or later developed technique, e.g., performing an in-situ pre-clean, depositing a metal such as tungsten, titanium, nickel, cobalt, etc., annealing to have the metal react with silicon, and removing unreacted metal. As also shown in FIG. 1, preliminary structure 100 may include any number of STIs 116. As known in the field, STIs 116 are formed by creating a trench etched into substrate 102 and filled (e.g., by depositing) with an insulating material such as oxide, to isolate one region of substrate 102 from an adjacent region of thereof. One or more semiconductor devices 100 of a given polarity may be disposed within an area isolated by an STI 116.

With further regard to sacrificial spacer 110, sacrificial spacer 110 may be formed, e.g., deposited and etched, prior to formation of a via layer 120. Sacrificial spacer 110 may include, for example, silicon oxide, silicon oxide plus silicon, germanium, SiLK or a similar polymer stable to, for example, 400° Celsius (C) with low temperature silicide, or layers thereof (see FIG. 19). Alternatively, in any of the embodiments described herein, the sacrificial spacer may be formed after removing conventional implant spacers used to direct source/drain (S/D) implants, and prior to first dielectric layer 122 formation. In any event, sacrificial spacer 110 according to embodiments of the disclosure can be removed to form an airgap spacer (e.g., 140 in FIGS. 5-6) adjacent gate 106. As will be described in greater detail herein, gate 106 may take a variety of alternative forms from that shown in FIG. 1, which changes the arrangement of sacrificial spacer 110 and the airgap spacer relative thereto. In any event, sacrificial spacer 110 extends along an entirety of a thickness of gate 106, e.g., all of gate body 108 including any gate dielectric (not shown), metal/polysilicon body and/or silicide layer 112 (FIG. 1).

Preliminary structure 100 is also shown with a via layer 120 formed thereon. Via layer 120 may be referred as a zero via (V0) layer as it is the first via layer over semiconductor device(s) 100. Via layer 120 forming may include forming at least one first dielectric layer 122 about sacrificial spacer 110 and gate 106, and forming at least one contact 124 through first dielectric layer(s) 122 to a portion of transistor 104, e.g., gate 106 or S/D region 107. First dielectric layer(s) 122 may include any now known or later developed interlayer dielectric (ILD) material such as but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Any dielectric layer described herein, e.g., first dielectric layer(s) 122, may include one or more layers of the above-described material. Via layer 120 may also include one or more contacts 124 (vias) formed therein to gate 106 and/or SD regions 107, observed best in FIG. 2. Contact(s) 124 may be formed using any now known or later developed technique. For example, a mask may be patterned over first dielectric layer(s) 122, an etch may be performed to create openings in ILD 122, and a conductor 126, e.g., copper, may be deposited in the openings. Any necessary liner (not shown) may be employed. A planarization, e.g., chemical mechanical polishing, may be carried out thereafter to remove excess conductor.

Figure 3:
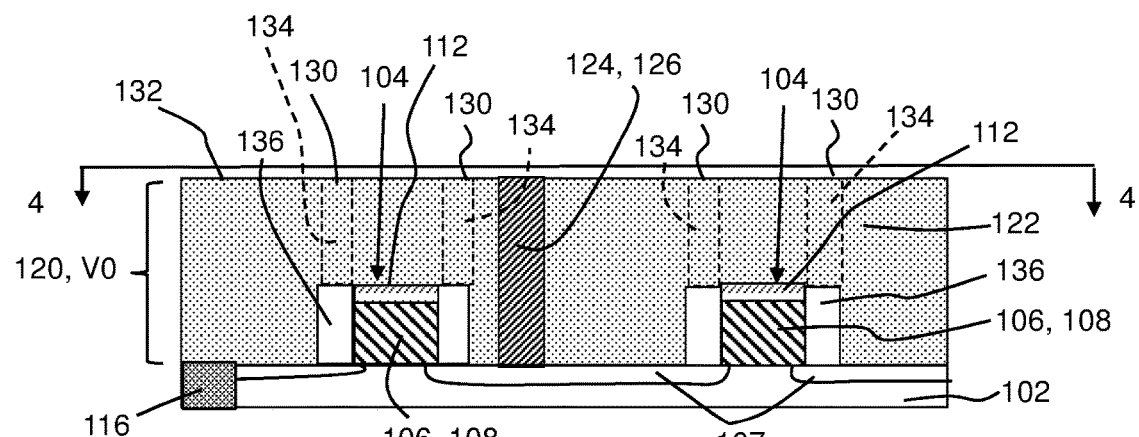
FIG. 3 shows a cross-sectional view of removing of a sacrificial spacer according to embodiments of the disclosure (see line 3-3 in FIG. 4).
Figure 4:
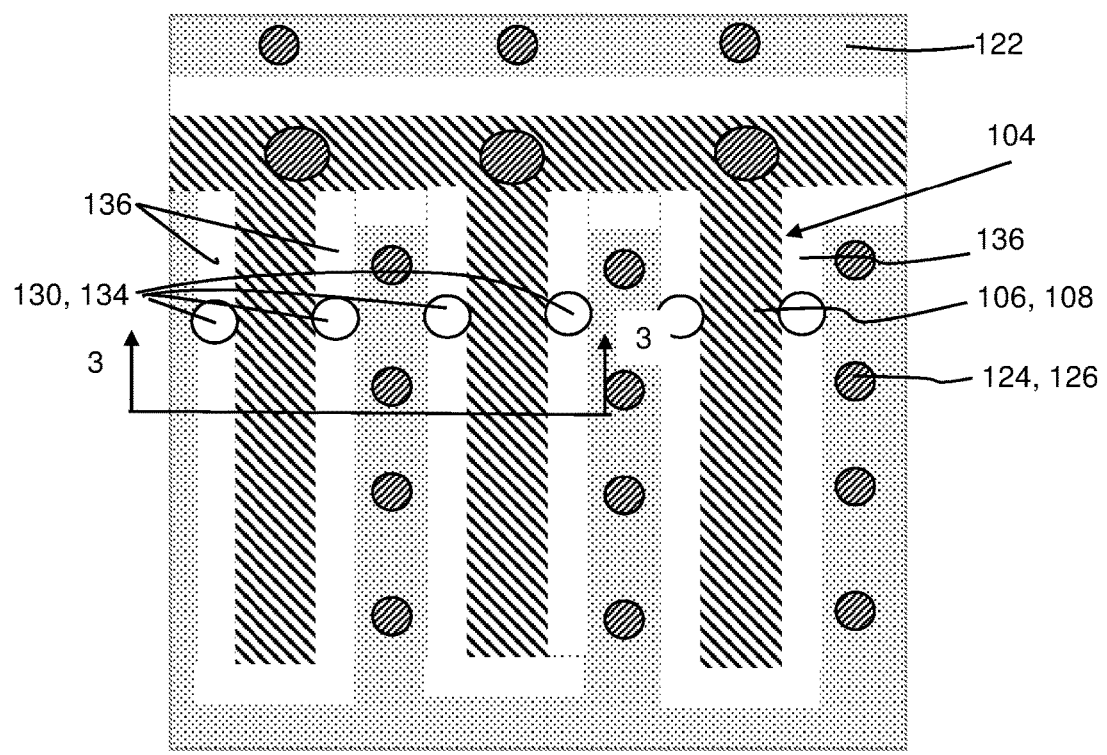
FIG. 4 shows a schematic top view of the structure of FIG. 3 along line 4-4.

FIG. 3 shows a cross-sectional view and FIG. 4 shows a schematic top view of further processing according to the disclosure. In particular, FIGS. 3 and 4 show removing at least a portion of sacrificial spacer 110. Sacrificial spacer 110 may be removed in a number of ways. In one embodiment, removing at least a portion of sacrificial spacer 110 includes forming an air vent passage 134 (shown in phantom in FIG. 3) to sacrificial spacer 110 through first dielectric layer(s) 122 and etching to expose sacrificial spacer 110, e.g., by forming and patterning a mask and etching air vent passages 134, then using a selective wet or dry etch process to remove sacrificial spacer 110. Further etching may remove sacrificial spacer 110 through first dielectric layer(s) 122, leaving open air spaces 136. Here, most if not all of sacrificial spacer 110 is removed. Any number of air vent passages 134 necessary may be employed to remove sacrificial spacer 110 (six shown in FIG. 4). Air vent passage(s) 134 may extend from sacrificial spacer 110 through first dielectric layer(s) 122 to air vent opening 130 without intersecting contact(s) 124. As will be described, air vent passage(s) 134 will eventually form part of an airgap spacer (e.g., 140 in FIGS. 5-6).

Figure 5:
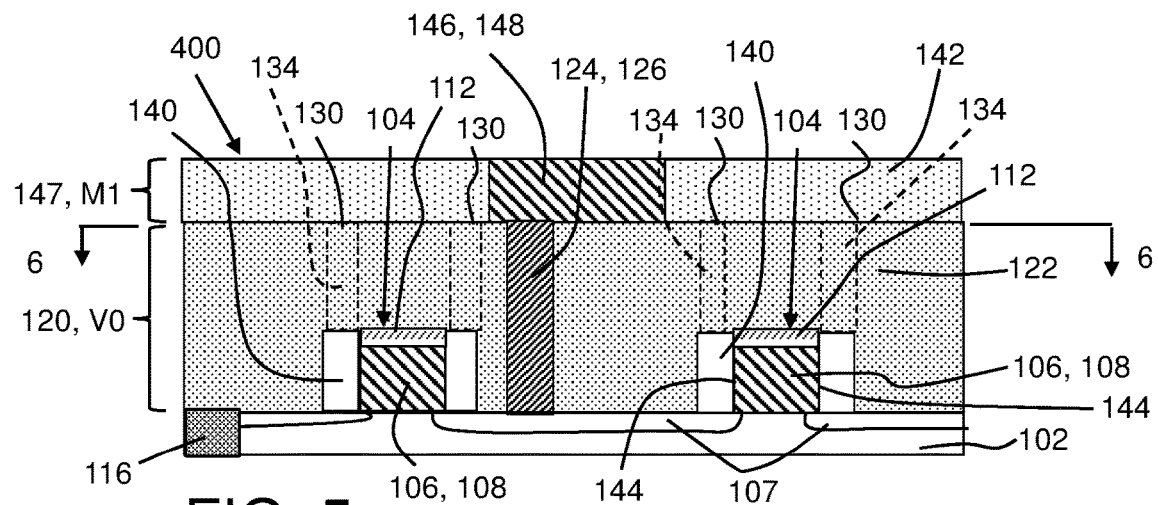
FIG. 5 shows a cross-sectional view of forming an airgap spacer according to embodiments of the disclosure (see line 5-5 in FIG. 6).
Figure 6:
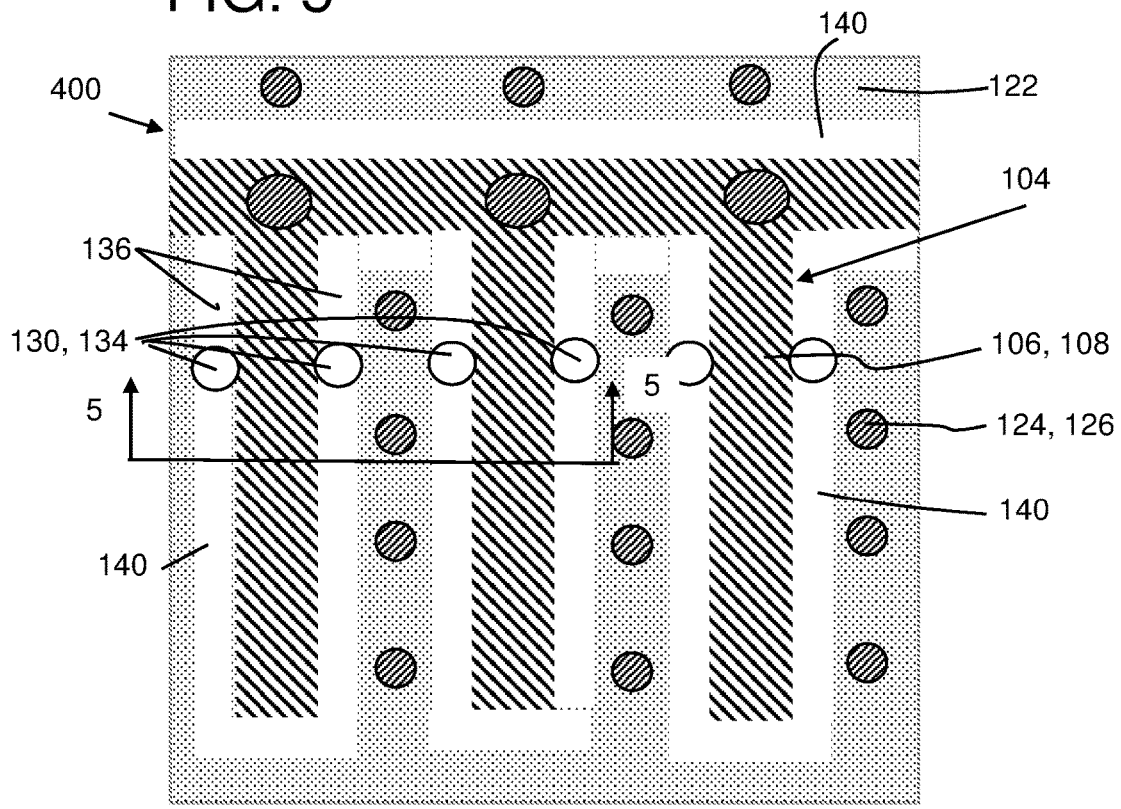
FIG. 6 shows a schematic top view of the structure of FIG. 5 along line 6-6.

FIG. 5 shows a cross-sectional view and FIG. 6 shows a schematic top view through line 6-6 in FIG. 5 of further processing according to the disclosure. FIG. 5 shows forming an airgap spacer 140 in first dielectric layer(s) 122 by depositing at least one second dielectric layer 142 over first dielectric layer(s) 122 closing off air vent opening(s) 130. Second dielectric layer(s) 142 may be a wholly new dielectric layer or may be further first dielectric layer 122 material. In any event, second dielectric layer(s) 142 may include any ILD listed herein relative to first dielectric layer(s) 122. Second dielectric layer(s) 142 may be formed for example using PECVD silane oxide. As shown, second dielectric layer(s) 142 may also be used to form a metal layer (e.g., a first metal layer 147 (Ml)) that includes a metal wire 146. Metal wire(s) 146 may be formed using any now known or later developed technique. For example, a mask may be patterned over second dielectric layer(s) 142, an etch may be performed to create openings in second dielectric layer(s) 142, and a conductor 148, e.g., copper, may be deposited in the openings. Any necessary liner (not shown) may be employed. A planarization, e.g., chemical mechanical polishing, may be carried out thereafter to remove excess conductor. As shown in FIG. 5, airgap spacer 140 is coincident with at least one sidewall 144 of gate 106 and extends along an entirety of a thickness of gate 106. Airgap spacer 140 reduces capacitance between metal wire 146 to contact 124, metal wire 146 to gate 106 and contact 124 to gate 106. Since second dielectric layer(s) 142 closes of air vent passage(s) 134 rather than first dielectric layer(s) 122 (i.e., airgap spacer 140 is formed after contacts 124), significant airgap spacer 140 volume is not lost, preserving its efficacy in reducing capacitance. As described herein, the various embodiments of airgap spacers will be shown as on both sides of gate 106. It is emphasized that airgap spacers may be only on one sidewall 144 of gate 106. In any event, the airgap spacers are aligned with sidewall(s) 144.

Figure 7:
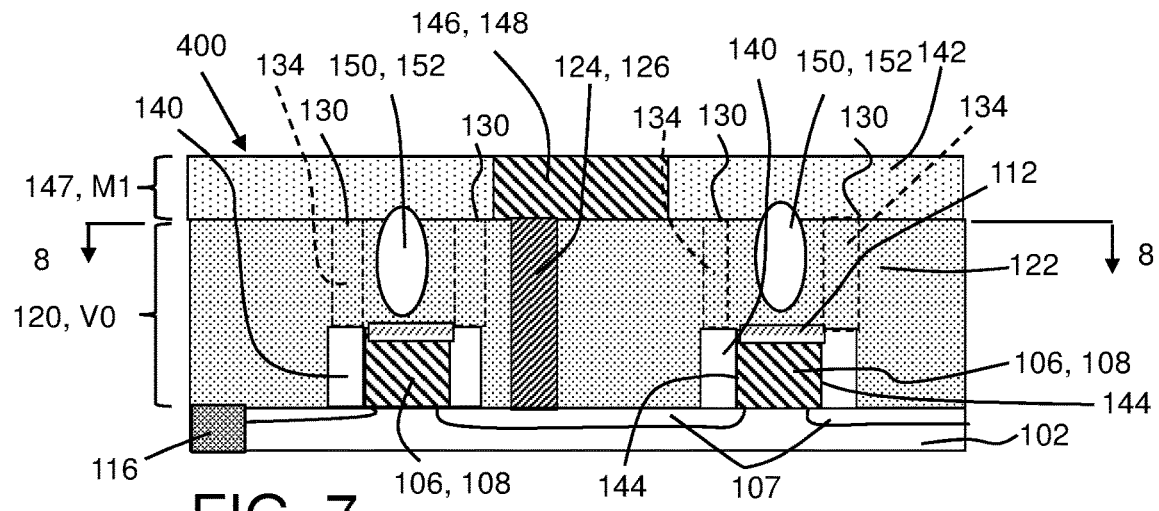
FIG. 7 shows a cross-sectional view of optionally forming a gate airgap according to embodiments of the disclosure (see line 7-7 in FIG. 8).
Figure 8:
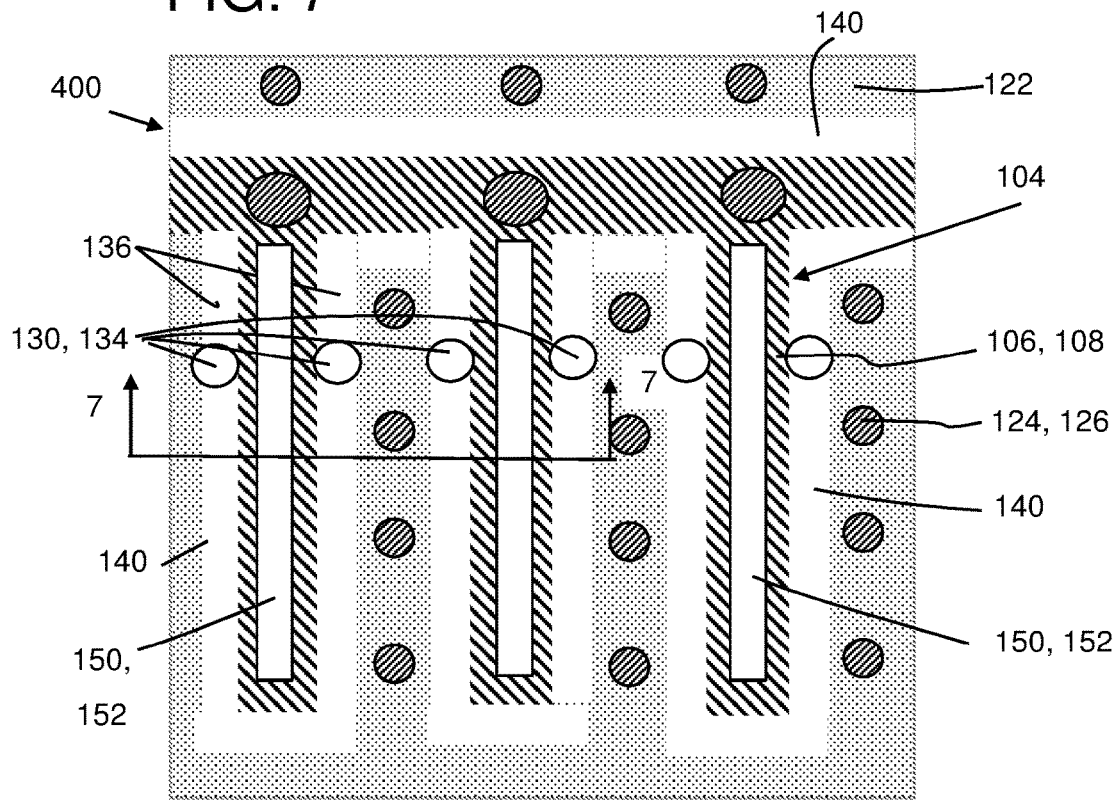
FIG. 8 shows a schematic top view of the structure of FIG. 7 along line 8-8.

FIG. 7 shows a cross-sectional view and FIG. 8 shows a schematic top view through line 8-8 in FIG. 7 of an optional process according to the disclosure. In this embodiment, during formation of air vent passages 134 (FIGS. 3-4), another opening 150 can be formed extending vertically above gate 106, e.g., by patterned masking and etching. Opening 150 is a vertical opening that does not extend over all of gate 106, as observed in FIG. 8. Opening 150 does not expose gate 106, e.g., silicide layer 112. As shown in FIG. 7, upon deposition of second dielectric layer(s) 142, a gate airgap 152 is formed extending vertically above gate 106 in first dielectric layer(s) 122 from opening 150. Second dielectric layer(s) 142 pinches off (closes) opening 150. Gate airgap 152 may further reduce capacitance between metal wire 146 to contact 124, metal wire 146 to gate 106 and contact 124 to gate 106.

Figure 9:
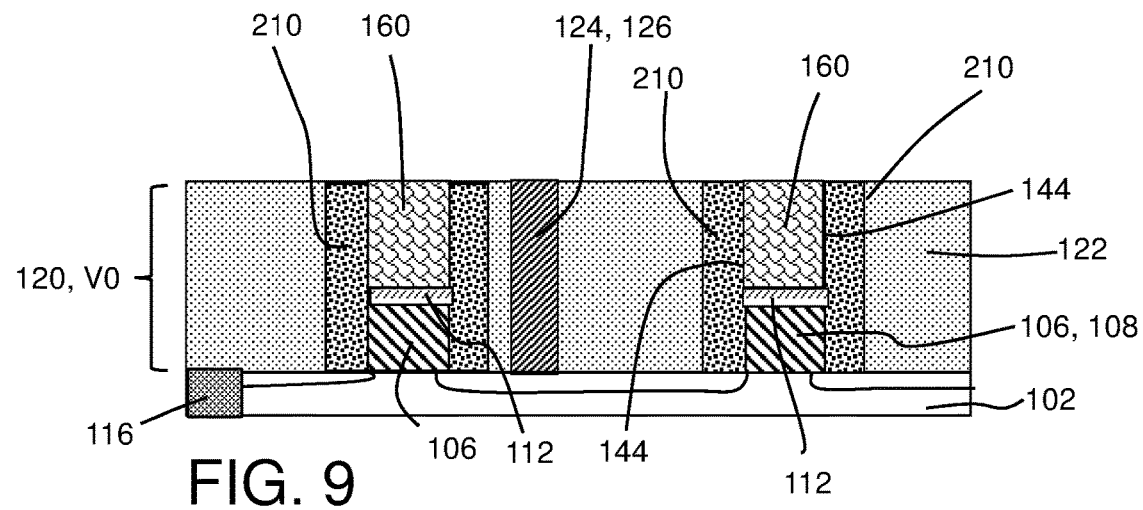
FIG. 9 shows a cross-sectional view of forming a preliminary structure according to another embodiment of the disclosure.
Figure 10:
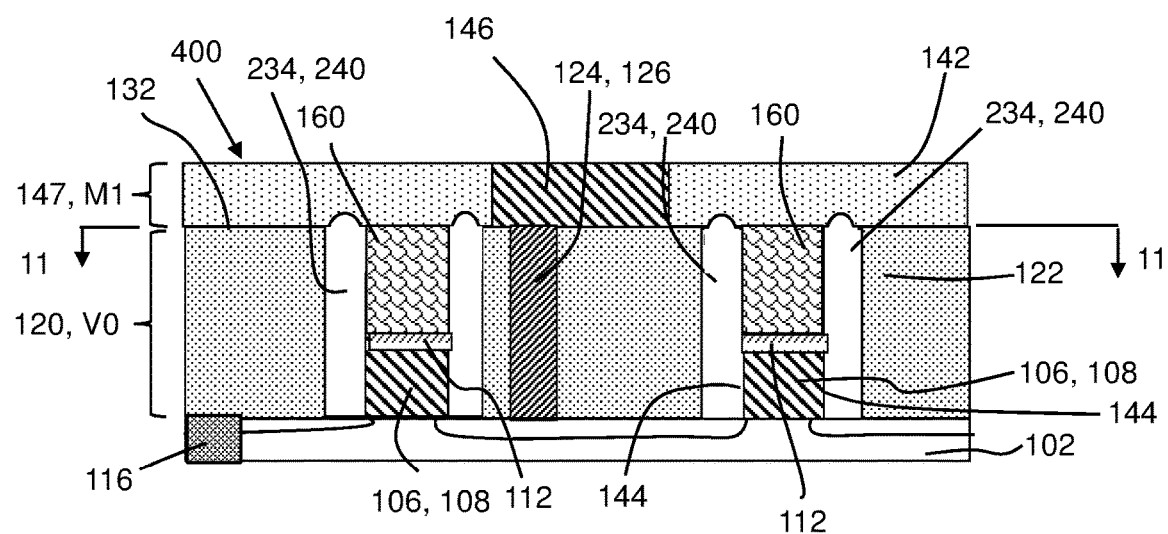
FIG. 10 shows a cross-sectional view of removing of a sacrificial spacer and forming an airgap spacer from FIG. 9 (see line 10-10 in FIG. 11).
Figure 11:
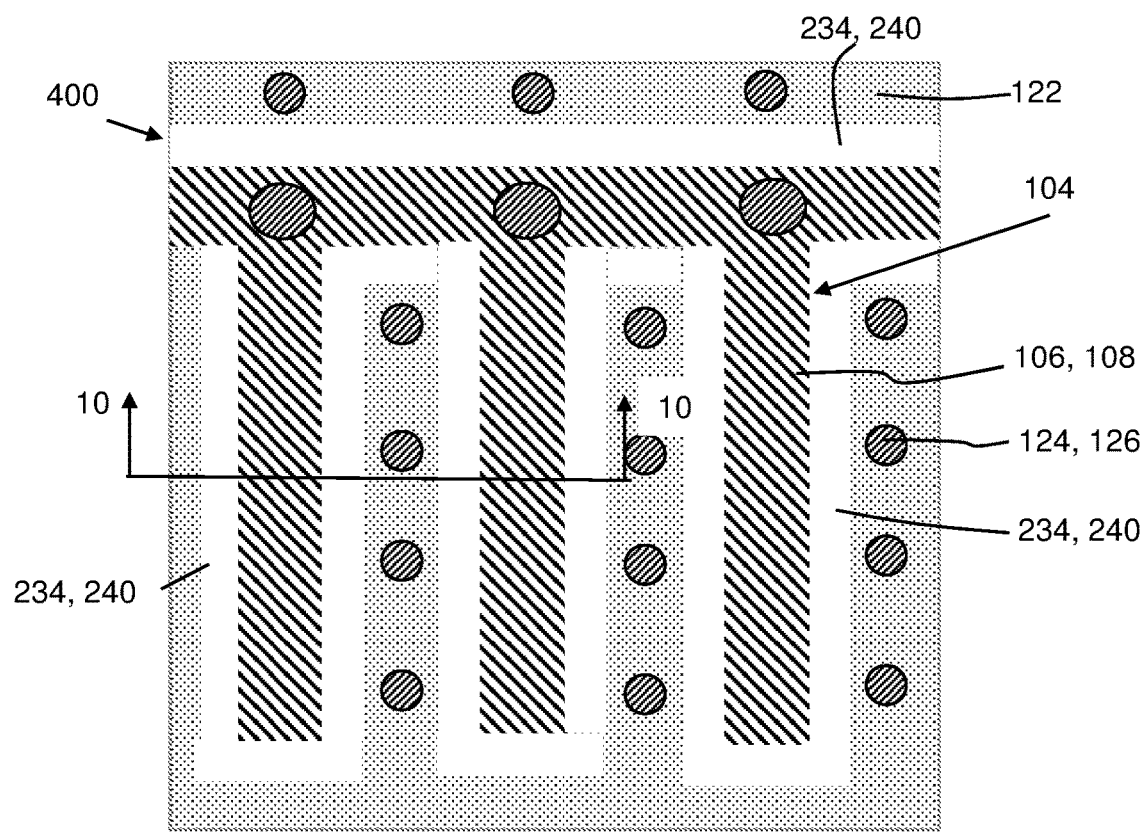
FIG. 11 shows a schematic top view of the structure of FIG. 10 along line 11-11.

FIGS. 9-10 show cross-sectional views, and FIG. 11 shows a schematic top view of an alternative embodiment according to the disclosure. Here, as shown in FIG. 9, gate 106 includes gate body 108 over substrate 102 (with perhaps a gate dielectric, not shown), silicide layer 112 over gate body 108 and a gate stack extender 160 over silicide layer 112. Gate stack extender 160 may include, for example, an oxide such as silicon oxide. Gate 106 may be formed using any now known or later developed processing, e.g., gate stack extender 160 may be formed in first dielectric layer(s) 122 by patterned masking, etching and deposition of material, or as part of gate body 108. In any event, in this embodiment, gate 106 extends an entire thickness of first dielectric layer(s) 122. Furthermore, a sacrificial spacer 210 formed about gate 106 extends the entire thickness of gate 106 and first dielectric layer(s) 122. That is, sacrificial spacer 210 is aligned with sidewall(s) 144 of gate body 108, and extends vertically through first dielectric layer(s) 122 therefrom. Sacrificial spacer 210 may include the same materials as those listed for sacrificial spacer 110 herein. Sacrificial spacer 210 may be formed by the same processes prior to formation of first dielectric layer(s) 122. More specifically, sacrificial spacer 210 is formed prior to S/D implants and contact 124 formation. Gate stack extender 160 is shown in FIGS. 9-10 on top of silicide layer 112. In this example, the process flow may include, for example, forming gate 106 (e.g., body 108), forming conventional spacers (not shown) thereabout, performing S/D implants, forming silicide (e.g., silicide layer 112 among others), removing conventional spacers, forming gate extender 160, forming sacrificial spacer 210, and then forming via layer 120. It is emphasized that sacrificial spacers 110, 210 may be different than implant spacers used for S/D implants. As shown in FIG. 10, sacrificial spacer 210 may be at least partially removed (as described relative to sacrificial spacer 110) to form air vent passages 234, i.e., prior to formation of first metal layer 147. Upon formation of second dielectric layer(s) 142, an airgap spacer 240 is formed that extends an entire thickness of first dielectric layer(s) 122, and extends the entire thickness of gate 106 along sidewall(s) 144 thereof. That is, airgap spacer 240 is aligned with sidewall(s) 144 of gate body 108, and extends vertically through first dielectric layer(s) 122 therefrom. Airgap spacer 240 thus provides increased volume to reduce capacitance, yet does not require additional spacer material to provide structural integrity. Airgap spacer 240 is sufficiently large such that deposition of second dielectric layer(s) 142 therein does not consume a sufficient volume of airgap spacer 240 to significantly impact its efficacy to reduce capacitance. Second dielectric layer(s) 142 may be used to form first metal layer 147, including metal wire 146. As shown in FIG. 11, rather than spaced vertical air vent passages 134 (e.g., FIG. 8), air vent passages 234 are laterally elongated and match the overall plan arrangement of airgap spacers 240. Airgap spacer 240 reduces capacitance between metal wire 146 to contact 124, metal wire 146 to gate 106 and contact 124 to gate 106.

Figure 12:
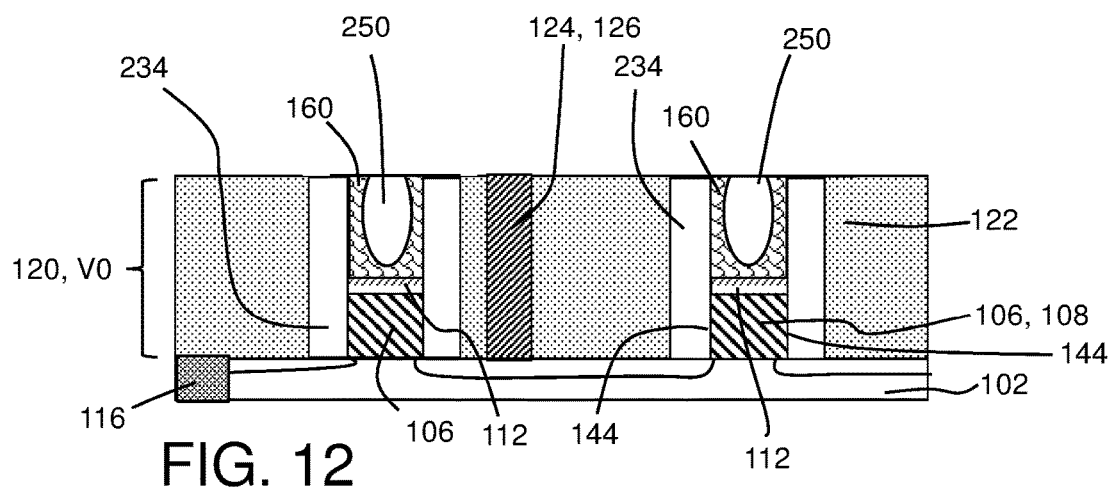
FIG. 12 shows a cross-sectional view of forming a gate airgap opening according to another embodiment of the disclosure.
Figure 13:
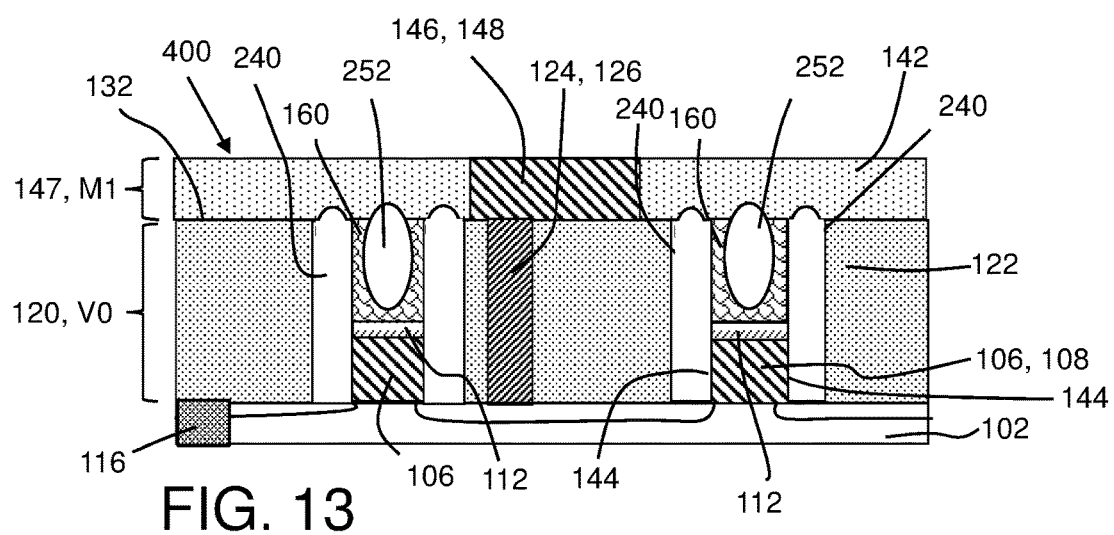
FIG. 13 shows a cross-sectional view of forming a gate airgap from the structure of FIG. 12.
Figure 14:
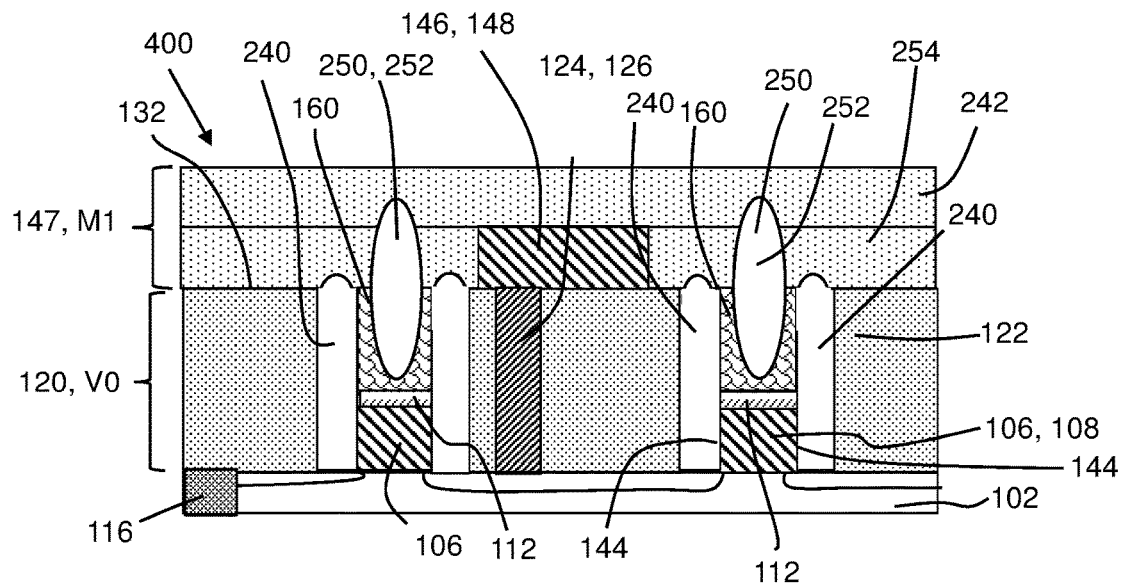
FIG. 14 shows a cross-sectional view of forming a gate airgap from the structure of FIG. 12 according to another embodiment of the disclosure.

FIGS. 12-14 show cross-sectional views of an alternative embodiment according to the disclosure. Here, the FIGS. 9-10 embodiment is revised to form a gate airgap 252 (FIG. 13) in gate stack extender 160. This process is similar to that described relative to FIGS. 7 and 8. Gate airgap 252 may be formed, for example as shown in FIG. 12, by, during formation of air vent passages 234, forming another opening 250 extending vertically above gate 106 within gate stack extender 160. As shown in FIG. 13, upon deposition of second dielectric layer(s) 142, gate airgap 252 is formed extending vertically above gate 106 in gate extender 160. Gate airgap 252 is otherwise similar to gate airgaps 152 (FIGS. 7-8). Second dielectric layer(s) 142 pinches off (closes) opening 250. Alternatively, as shown in FIG. 14, opening 250 may be formed after deposition of at least one third dielectric layer 254 on first dielectric layer(s) 122, which may include a metal wire 146 therein. In this case, opening 250 extends through third dielectric layer(s) 254. Here, opening 250 may be pinched off (closed) by deposition of second dielectric layer(s) 242 deposited over third dielectric layer(s) 254. Extension of gate airgap 252 into and through first metal layer 147 may further reduce capacitance between metal wire 146 to contact 124, metal wire 146 to gate 106 and contact 124 to gate 106.

Figure 15:
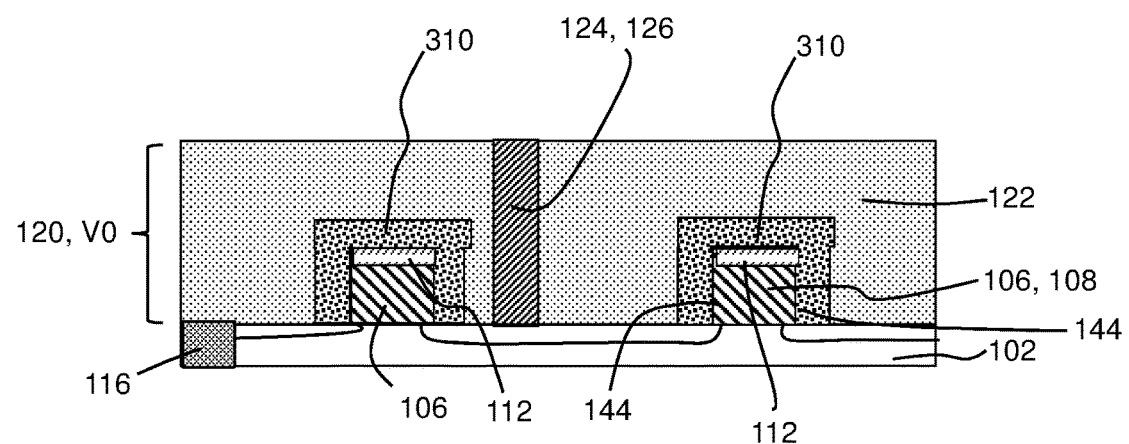
FIG. 15 shows a cross-sectional view of forming a preliminary structure according to another embodiment of the disclosure.
Figure 16:
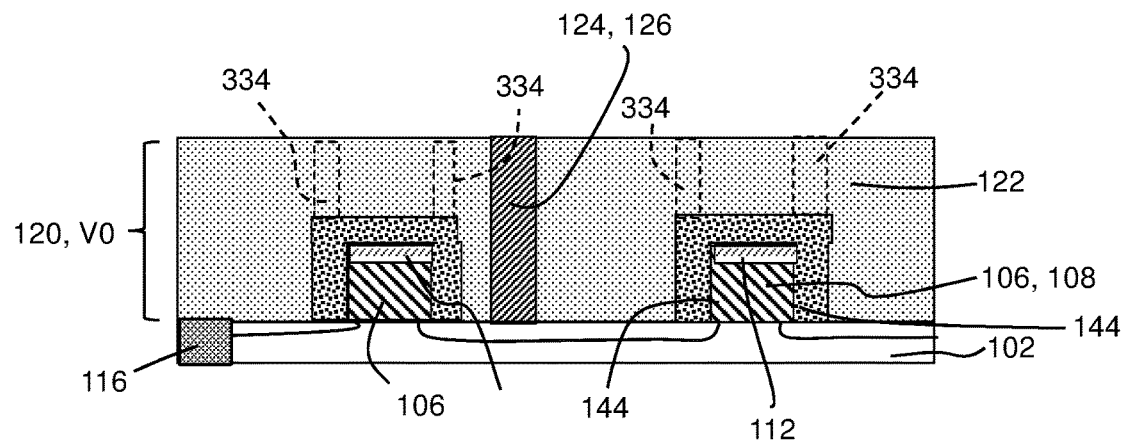
FIG. 16 shows a cross-sectional view of removing of a sacrificial spacer from the structure of FIG. 15.
Figure 17:
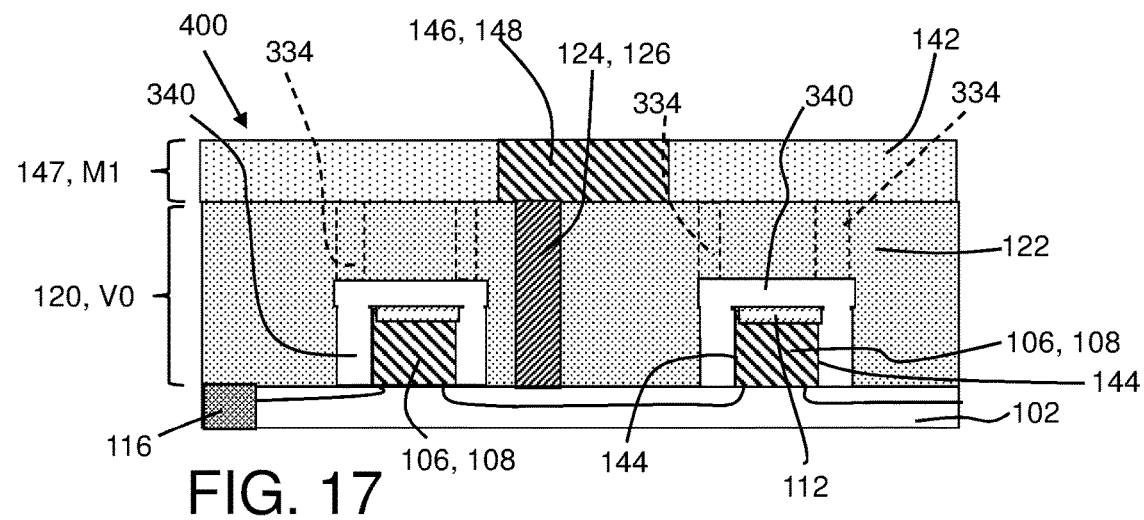
FIG. 17 shows a cross-sectional view of forming an airgap spacer from the structure of FIG. 16.

Referring to FIGS. 15 and 16, cross-sectional views of another alternative embodiment of the disclosure are shown. In these embodiments, a sacrificial spacer 310 extends not just along sidewall(s) 144 of gate 106, but also over gate 106. Sacrificial spacer 310 may be formed using any now known or later developed semiconductor processing technique. In one embodiment, sacrificial spacer 310 may be deposited over gate 106 and etched so as to leave sacrificial spacer 310 over gate 106 and along sidewalls 144 thereof. Subsequently, a single first dielectric layer 122 may be formed thereover, and contacts 124 formed therein. In another embodiment, sacrificial spacer 310 may be deposited over gate 106 and etched, and then first dielectric layer(s) 122 may be deposited. It is noted that it is also possible to remove a conventional implant spacer (not shown) after silicide layer 112 formation, and then form sacrificial spacer 310 on top of gate 106 and silicide layer 112. In any event, as shown in FIG. 15, sacrificial spacer 310 (and later an airgap spacer 340 (FIG. 17)) also extends over gate 106. Sacrificial spacer 310 may extend along an entire length of gate 106 (into and out of page) or portion(s) thereof. As shown in FIG. 16, air vent passages 334 may be formed to sacrificial spacer 310, as described herein, and sacrificial spacer 310 at least partially removed (in example here, all removed). As shown in FIG. 17, second dielectric layer(s) 142 may be deposited. Second dielectric layer(s) 142 pinches off (closes) air vent passages 334 used to create airgap spacer 340 that extends along sidewall(s) 144 and over gate 106, i.e., gate body 108 including silicide layer 112. Airgap spacer 340 provides additional volume compared to the FIGS. 5 and 6 embodiments, and further reduces capacitance while not significantly impacting structural integrity.

Figure 18:
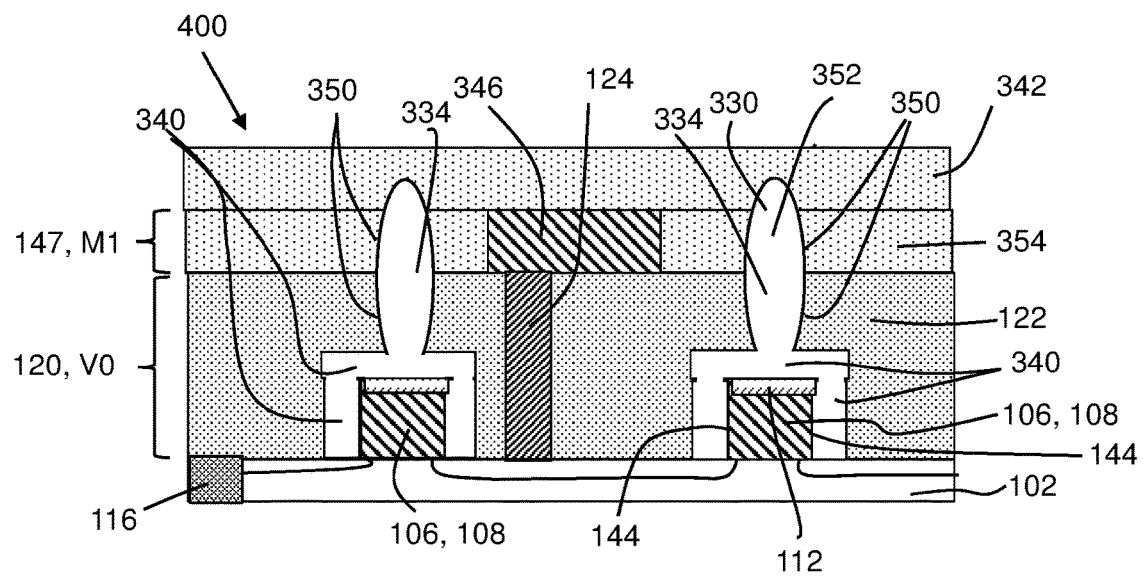
FIG. 18 shows a cross-sectional view of forming a gate airgap from the structure of FIG. 15 according to another embodiment of the disclosure.

FIG. 18 shows another embodiment in which a gate airgap 352 is formed contiguous with airgap spacer 340 over gate 106. In this example, at least one third dielectric layer 354 may be deposited over first dielectric layer(s) 122 prior to removing at least a portion of sacrificial spacer 310 (FIG. 15), i.e., over structure shown in FIG. 15, and after contact 124 formation. Third dielectric layer(s) 354 may have a metal wire 346 formed therein, as described herein relative to metal wire 146. Here, sacrificial spacer 310 may be at least partially removed by forming an opening 350 through third dielectric layer(s) 354 and first dielectric layer(s) 122 (opening 350 acts as air vent passage), and etching to remove sacrificial spacer 310. Upon deposition of second dielectric layer(s) 342 on third dielectric layer(s) 354, gate airgap 352 is formed from opening 350 and airgap spacer 340 is formed from where sacrificial spacer 310 has been removed. That is, uppermost second dielectric layer(s) 342 closes off air vent opening 330 in third dielectric layer(s)

354. Gate airgap 352 extends through third dielectric layer(s) 354, and air vent opening 330 is closed off by second dielectric layer(s) 342. Extension of gate airgap 352 into and through first metal layer 147 in conjunction with airgap spacer 340 extending over gate 106 may further reduce capacitance between metal wire 146 to contact 124, metal wire 146 to gate 106 and contact 124 to gate 106.

Referring to FIGS. 5, 7, 10, 13, 14, 17 and 18 embodiments of the disclosure also include a semiconductor device 400. Semiconductor device 400 includes transistor 104 on substrate 102 (i.e., on or in). Transistor 104 includes gate body 108. First dielectric layer(s) 122 may extend about gate 106 and gate body 108, in particular. Airgap spacer 140, 240, 340 may be adjacent to at least one sidewall 144 of gate body 108 in first dielectric layer(s) 122 and extend along an entirety of a thickness of gate body 108. In FIGS. 10, 13 and 14, airgap spacer 240 extends vertically above a height of gate body 108. In FIGS. 5, 7 and 17, where vertically extending hole-like air vent passages 134 are used, they may be contiguous with airgap spacer 140 or 340, and may extend from airgap spacer 140 or 340 through first dielectric layer(s) 122 to at least an upper surface 132 (FIG. 3) of the first dielectric layer(s). Second dielectric layer(s) 142, 242 may extend over first dielectric layer(s) 122 or third dielectric layer(s) 354, and pinch off (close) an upper end of air vent passage(s) 134, 234, 334 to form airgap spacer 140, 240, 340, respectively. As observed in, for example FIGS. 5 and 10, the airgap spacer (regardless of embodiment) is devoid of any spacer material, i.e., there is no other material therein providing structural support. This is in contrast to many conventional airgap spacers that require ancillary support to maintain structural integrity.

As shown in the schematic top view in FIG. 2, in any of the embodiments, first dielectric layer(s) 122 may include at least one of: a gate contact 180 extending through first dielectric layer(s) to gate body 108, e.g., directly or to silicide layer 112 thereover, a source contact 182 extending through first dielectric layer(s) 122 to a source 184 of transistor 104 (below first dielectric layer(s) 122), and a drain contact 186 extending through first dielectric layer(s) 122 to a drain 188 (below first dielectric layer(s) 122) of transistor 104. In all embodiments, none of contacts 180, 182, 186 intersect airgap spacer 140, 240, 340. As noted, gate body 108 may include silicide layer 112 at an upper surface thereof.

In optional embodiments, shown in FIGS. 7, 8, 13, 14 and 18, gate airgap 152, 252, 352 may be positioned over gate 106, i.e., gate body 108, in at least first dielectric layer 122, and may extend into second dielectric layer(s) 142 and/or third dielectric layer(s) 354 (where provided—FIGS. 14 and 18) over first dielectric layer(s) 122. Gate airgap 152, 252, 352 is located at least partially over gate 106, i.e., gate body 108, in contrast to air vent passages 134, 234, 334 which may be located anywhere capable of allowing for removal of sacrificial spacer 110, 210, 310, respectively.

In FIGS. 17 and 18, airgap spacer 340 also extends over an upper surface of gate body 108, e.g., over silicide layer 112. In FIG. 18, air vent passage 334 forms gate airgap 352 and is positioned over gate body 108 in at least first dielectric layer 122 and is contiguous with airgap spacer 340 positioned over the upper surface of gate body 108.

In FIGS. 10, 13 and 14, removal of sacrificial spacer 210 opens an elongated air vent passage 234 (into and out of page) due to sacrificial spacer 210 extending to an upper surface 132 of first dielectric layer(s) 122 (rather than an air vent passage 134 that is simply a vertical tube). As shown in FIG. 11, air vent passage 234 aligns with the eventually formed airgap spacer 240. In this case, second dielectric layer(s) 142 over first dielectric layer(s) 122 pinches off (closes) an upper end of airgap spacer 240 along a length of airgap spacer 240, i.e., into an out of page in FIGS. 10, 13 and 14.

In FIGS. 10, 13 and 14, gate 106 includes gate body 108 over substrate 102, silicide layer 112 over gate body 108 and may optionally include gate stack extender 160 over silicide layer 112. Gate stack extender 160 extends to upper surface 132 of first dielectric layer(s) 122. In these embodiments, airgap spacer 240 in first dielectric layer(s) 122 is coincident with at least one sidewall 144 of gate 106 (i.e., gate body 108, silicide layer 112 and gate stack extender 16) and airgap spacer 240 extends along an entirety of a thickness of the gate and extends through an entirety of a thickness of first dielectric layer(s) 122. This arrangement is in contrast to the FIGS. 5, 7, 17 and 18 embodiments in which the airgap spacer extends only to a thickness of gate body 108. In FIGS. 13 and 14, gate airgap 252 extends over gate body 108 in at least gate stack extender 160, and may extend into second dielectric layer(s) 242.

Figure 19:
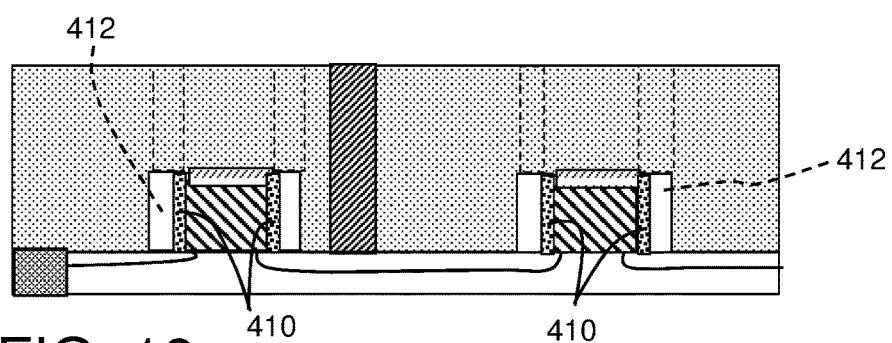
FIG. 19 shows a cross-sectional view of forming an airgap spacer using a multi-layer sacrificial spacer applicable to the various embodiments of the disclosure.

While airgap spacers are shown in the various drawings herein as unitary spaces, it is emphasized that they may be provided, where desired or necessary, in smaller segments in larger devices for structural integrity. Further, sacrificial pacers 110 (FIG. 1), 210 (FIG. 9), and 310 (FIG. 15) may be composed of multiple layers where one or more of the layers is removed to form the airgap spacer, leaving one or more of the layers unremoved. For example, FIG. 19 shows the FIG. 3 embodiment, in which a remaining inner layer 410, such as $SiO_2$, contacts gate 106 side and an outer layer 412 (shown removed), such as Si, contacts inner layer 410 and the airgap spacer is subsequently formed by removing the outer layer and leaving inner layer 410, i.e., partially removing the sacrificial spacer. In this case, gate 106 would be considered to include inner layer 410, and sacrificial spacer would include only the outer layer. While shown with the FIG. 3 embodiment, the teachings of this embodiment are equally applicable to any embodiment described herein.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not. The terms "first," "second," "third," etc. are used simply as differentiating references between identical or similar elements, and do not connote any required number, position or order of elements to which applied.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A semiconductor device, comprising:
   a transistor on a substrate, the transistor including a gate body;
   a first dielectric layer about the gate body;
   an airgap spacer adjacent to at least one sidewall of the gate body in the first dielectric layer and extending along an entirety of a thickness of the gate body;
   an air vent passage contiguous with the airgap spacer and extending from the airgap spacer through the first dielectric layer to at least an upper surface of the first dielectric layer;
   a second dielectric layer over the first dielectric layer, the second dielectric layer pinching off an upper end of the air vent passage; and
   a gate airgap positioned over an upper surface of the gate body in at least the first dielectric layer.

2. The semiconductor device of claim 1, wherein the airgap spacer is devoid of any spacer material.

3. The semiconductor device of claim 1, wherein the airgap spacer also extends over the upper surface of the gate body.

4. The semiconductor device of claim 3, wherein the air vent passage forms the gate airgap positioned over the upper surface of the gate body in at least the first dielectric layer and is contiguous with the airgap spacer positioned over the upper surface of the gate body.

5. The semiconductor device of claim 1, wherein the first dielectric layer includes therein at least one of:
   a gate contact extending through the first dielectric layer to the gate body, a source contact extending through the first dielectric layer to a source of the transistor, and a drain contact extending through the first dielectric layer to a drain of the transistor,
   wherein none of the gate contact, source contact, and drain contact intersect the airgap spacer.

6. The semiconductor device of claim 1, wherein the gate body includes a silicide layer at an upper surface thereof.

7. A semiconductor device, comprising:
   a transistor on a substrate, the transistor including a gate including a gate body over the substrate, a silicide layer over the gate body and a gate stack extender over the silicide layer;
   a gate airgap extending over the gate body in at least the gate stack extender;
   a first dielectric layer about the gate, the gate stack extender extending to an upper surface of the first dielectric layer;
   an airgap spacer in the first dielectric layer, the airgap spacer coincident with at least one sidewall of the gate, the airgap spacer extending along an entirety of a thickness of the gate and extending through an entirety of a thickness of the first dielectric layer; and
   a second dielectric layer over the first dielectric layer, the second dielectric layer pinching off an upper end of the airgap spacer along a length of the airgap spacer.

8. The semiconductor device of claim 7, wherein the airgap spacer is devoid of any spacer material.

9. The semiconductor device of claim 7, wherein the first dielectric layer includes therein at least one of:
   a gate contact extending through the first dielectric layer to the gate body, a source contact extending through the first dielectric layer to a source of the transistor, and a drain contact extending through the first dielectric layer to a drain of the transistor,
   wherein none of the gate contact, source contact, and drain contact intersect the airgap spacer.

10. The semiconductor device of claim 7, wherein the second dielectric layer includes therein a metal wire.

11. The semiconductor device of claim 7, wherein the airgap spacer is aligned with the at least one sidewall of the gate.

12. A method, comprising:
   forming a transistor on a substrate, the transistor including a gate, the gate including a gate body over the substrate, a silicide layer over the gate body and a gate stack extender over the silicide layer;
   forming a sacrificial spacer extending along an entirety of a thickness of the gate;
   forming at least one first dielectric layer about the sacrificial spacer and the gate;
   forming at least one contact through the at least one first dielectric layer to a portion of the transistor;
   removing at least a portion of the sacrificial spacer, leaving an air vent opening;
   forming an airgap spacer in the at least one first dielectric layer by depositing a second dielectric layer to close off the air vent opening, wherein the airgap spacer is coincident with at least one sidewall of the gate and extends along an entirety of a thickness of the gate; and
   forming a gate airgap in the gate stack extender.

13. The method of claim 12, wherein removing the at least a portion of the sacrificial spacer includes forming an air vent passage to the sacrificial spacer through the at least one first dielectric layer and etching to remove the sacrificial spacer, the air vent passage extending from the sacrificial spacer through the at least one first dielectric layer to the air vent opening without intersecting the at least one contact, the air vent passage forming part of the airgap spacer.

14. The method of claim 12, further comprising depositing a third dielectric layer prior to removing the sacrificial spacer,
   wherein the gate airgap extends through the third dielectric layer, and
   wherein the third dielectric layer includes a metal wire.

15. The method of claim 12, wherein forming the gate airgap in the gate stack extender includes:
   during removing the at least a portion of the sacrificial spacer, forming another opening extending vertically above the gate within the gate extender; and
   closing off the another opening upon the depositing of the second dielectric layer.

* * * * *